United States Patent [19]

Suzuki et al.

[11] Patent Number: 4,490,578

[45] Date of Patent: Dec. 25, 1984

[54] INTEGRATED SUPERCONDUCTOR

[75] Inventors: Shohei Suzuki, Takahagi; Yoshiaki Kazawa; Ryusei Saito, both of Hitachi; Koji Noguchi, Tsuchiura; Hidezumi Moriai, Tsuchiura; Ryoichi Mashiko, Tsuchiura; Shuji Sakai, Tsuchiura, all of Japan

[73] Assignees: Hitachi Cable, Ltd.; Hitachi, Ltd., both of Tokyo, Japan

[21] Appl. No.: 511,481

[22] Filed: Jul. 7, 1983

[30] Foreign Application Priority Data

Jul. 9, 1982 [JP] Japan ................. 57-118388

[51] Int. Cl.³ ............................. H01B 12/00
[52] U.S. Cl. ................. 174/15 S; 174/126 S; 174/128 S
[58] Field of Search ............... 174/15 S, 126 S, 128 S

[56] References Cited

U.S. PATENT DOCUMENTS

| 4,148,129 | 4/1979 | Young ................... 174/126 S X |
| 4,200,767 | 4/1980 | Nomura et al. ............ 174/126 S |
| 4,285,120 | 8/1981 | Nomura et al. ........... 174/126 S X |
| 4,334,123 | 6/1982 | Tada et al. .............. 174/128 S X |
| 4,421,946 | 12/1983 | Furuto et al. ........... 174/126 S X |

OTHER PUBLICATIONS

Scanlon, R. M. et al., "Development and Manufacture of A Nb₃Sn Superconductor for the High-Field Test Facility"; Conf: 9th Symposium on Engineering Problems of Fusion Research, Chicago, Ill. U.S.A.; Oct. 26-29, 1981.

Primary Examiner—John F. Gonzales
Assistant Examiner—Morris H. Nimmo
Attorney, Agent, or Firm—Antonelli, Terry & Wands

[57] ABSTRACT

A superconductor which includes a housing of a highly pure copper having a slot therein for accommodating a plurality of monolithic superconductor members and a reinforcing member. A highly pure aluminum lid or cover is adapted to be disposed in an opening of the slot, with outer surfaces of the lid or cover having arranged thereon highly pure copper. The lid or cover, the monolithic superconductor members, the reinforcing member, and the housing are integrated and bonded together by a bonding material such as, for example, solder.

20 Claims, 4 Drawing Figures

INTEGRATED SUPERCONDUCTOR

BACKGROUND OF THE INVENTION

The present invention relates to a superconductor and, more particularly, to an integrated superconductor suitable for use as, for example, a superconductive coil for a large scale, high intensity field magnet, generator and the like.

Large capacity current carrying superconductors with, for example, an available range of over 1000 amperes have been proposed wherein several monolithic superconductor members are provided, with each of the monolithic superconductor members including an extra fine multi-filamentary superconductor element fashioned of, for example, Nb-Ti or $Nb_3Sn$ alloys, with the monolithic superconductor members being inserted into an appropriate slot or channel of a housing fashioned of a highly pure copper. A lid or cover member, also of highly pure copper is provided for covering an open end of the slot or channel so as to prevent the monolithic superconductor members from being displaced therefrom. Subsequent to the disposal of the monolithic superconductor members, an appropriate adhesive material such as, for example, solder is directed into the slot or channel so as to bind and integrate the lid or cover member along with the monolithic superconductor members into the housing.

A superconductor of the aforementioned type is generally disposed in a chamber and cooled by using a coolant such as, for example, liquid helium, with temperatures reaching below an extremely low temperature such as, for example, 4.2° K., in order to maintain a superconductive state. In the event the superconductor is not maintained at predetermined low temperatures, the superconductive state, at least partially, changes into a normal conductive state and, in a large, high intensity field magnet, when the transition from a superconductive state to a normal conductive state affects the whole conductor, i.e., a quenching operation, a large amount of the stored energy burns out of the superconductive coil and an over-pressure results in a breakdown of a helium chamber. Consequently, a superconductor is usually constructed so that the heat generated during a partial normal conductive state is usually less than the heat capable of being cooled by the liquid helium.

In order to protect, e.g., superconductive coils from excessive temperatures during a superconductive-to-normal transition, it has been proposed to provide an external low resistance conductor across the superconductive coil terminals, with the relatively high pure copper housing and lid or cover member serving as an external low resistor so as to form a so-called "stabilizer" for the superconductor. Advantageously, the stabilizer is usually made of a highly pure copper.

Since a resistance value of pure aluminum is less than that of pure copper, it has been proposed to utilize aluminum in the fashioning of the stabilizer; however, when highly pure aluminum is used as a stabilizer and integrated by, for example, soldering or the like with the monolithic superconductive member covered with a high pure copper, it is extremely difficult to bond the high pure copper to the monolithic superconductive member. Consequently, the high resistance at the bonding surfaces cause a considerable generation of heat such that no sufficient stable conductors may readily be obtained.

In, for example, Japanese Laid-Open Application No. 56-24361, it has been proposed to sandwich or interpose a monolithic superconductive member between stabilizers which are fashioned of pure aluminum bars covered with pipes of oxygen-free copper; however, a disadvantage of this proposal resides in the fact that the so constructed superconductor element has a soft weak aluminum portion and, consequently, is not suitable for use as a high intensity field magnet which requires the ability to endure strong magnetic forces.

SUMMARY OF THE INVENTION

The aim underlying the present invention essentially resides in providing a superconductor using a high pure aluminum material as a stabilizer.

In accordance with advantageous features of the present invention, a monolithic superconductive element is inserted into a slot or channel formed in a high pure copper housing with a lid member, of a high pure aluminum covered with a high pure copper being disposed at an opening of the slot or channel, and with the lid, the monolithic superconductive member, and the housing being bonded together by, for example, soldering or the like.

In accordance with further advantageous features of the present invention, the housing may be provided with a reinforcing member disposed at a bottom of the slot or channel, with the reinforcing member serving to stabilize the construction.

Accordingly, it is an object of the present invention to provide a superconductor which exhibits a low resistance at a bonding surface between a highly pure aluminum stabilizer and a monolithic superconductive element.

Another object of the present invention resides in providing a superconductor element having sufficient strength.

A still further object of the present invention resides in providing a superconductor which avoids, by simple means, shortcomings and disadvantages encountered in the prior art.

Yet another object of the present invention resides in providing a superconductor which functions reliably under all transitional states of operation.

These and other objects, features, and advantages of the present invention will become more apparent from the following description when taken in connection with the accompanying drawings which show, for the purposes of illustration only, two embodiments in accordance with the present invention, and wherein:

DETAILED DESCRIPTION

Figure 1:
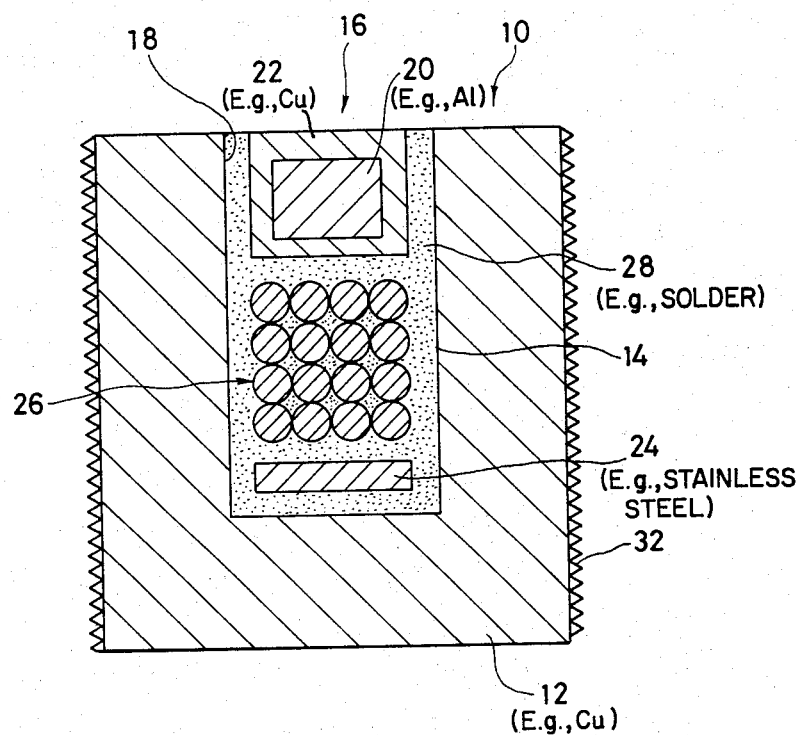
FIG. 1 is a cross-sectional view of an integrated superconductor constructed in accordance with the present invention.

Referring now to the drawings wherein like reference numerals are used throughout the various views to designate like parts and, more particularly, to FIG. 1, according to this figure, a stabilizer generally designated by the reference numeral 10 includes a housing 12 formed of a highly pure copper, with the housing 12 being provided with a slot or channel 14. A lid or cover member generally designated by the reference numeral 16 is provided and is adapted to be disposed so as to close an opening 18 of the slot or channel 14. The lid or cover member 16 includes a highly pure aluminum portion 20, with an outer surface of the aluminum portion 20 being covered with a highly pure copper portion 22. Advantageously, the lid or cover member 16 may be formed by a hydrostatic extrusion.

A reinforcing member 24, formed, for example, as a stainless steel plate, is arranged in a bottom or lower area of the slot or channel 14, with the reinforcing member being adapted to increase the mechanical strength of the superconductor.

A plurality of monolithic superconductor elements generally designated by the reference numeral 26 are accommodated in the slot or channel 14 between the reinforcing member 24 and the lid or cover member 16. After the reinforcing member 24, monolithic superconductive elements 26, and lid or cover member 16 are mounted in the slot or channel 14, an appropriate bonding material such as, for example, solder or the like, is introduced into the slot or channel 14 so as to bond and integrate the housing 12, monolithic superconductive elements 26, and the lid or cover member 16.

Since the outer surface of the lid or cover member is covered with a highly pure copper portion 22, the resistance at the bonding surface between the lid or cover member 16 and the monolithic superconductive elements 26 is considerably reduced.

Figure 3:
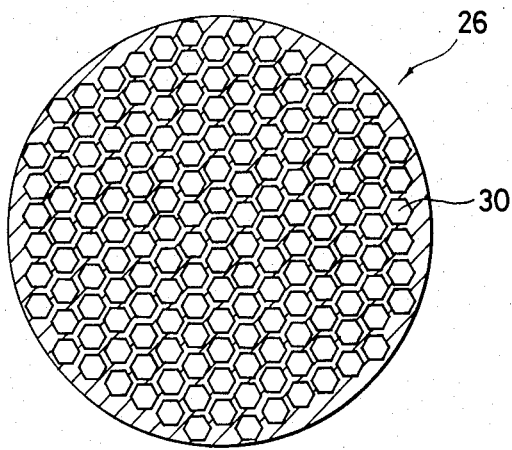
FIG. 3 is a cross-sectional view, on an enlarged scale, of a monolithic superconductive element of an integrated superconductor, e.g., for a superconductive coil, constructed in accordance with the present invention.

Advantageously, as shown most clearly in FIG. 3, the monolithic superconductive member 26 is fashioned of, for example Nb$_3$Sn multifilamentary superconductors 30 which may, for example, have a filament diameter of 4 $\mu$m, with the number of filaments being equal to, for example 77,454.

Figure 4:
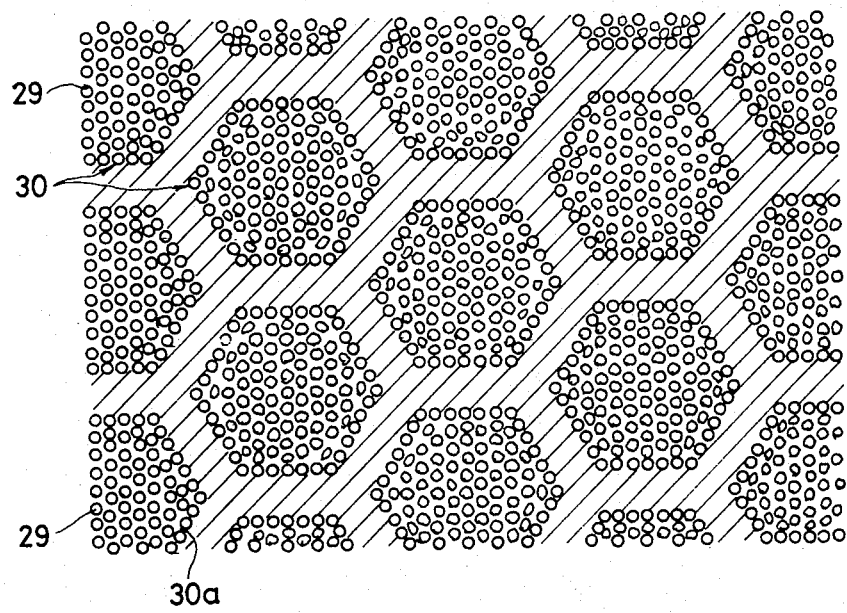
FIG. 4 is a cross-sectional view, on an enlarged scale, of components of the respective monolithic superconductive elements of an integrated superconductor constructed in accordance with the present invention.

As shown most clearly in FIG. 4, each of the monolithic superconductive members 26 is usually fashioned of oxygen free copper conduits or pipes 30a formed in the monolithic superconductive members 26, in which conduits or pipes 30a are accommodated a plurality of copper clad superconductive wires 29, with the conduits or pipes 30a being tightly packed into a hexagonal arrangement.

A monolithic superconductive member 26 constructed in accordance with the present invention may, for example, be produced by a hydrostatic extrusion method, since such method is ideal for producing large scale superconductive wires, whereby the conduits or pipes 30a for accommodating the superconductive wires 29 are formed during the extrusion process. Moreover, as shown in FIG. 1, an outer surface 32 of the highly pure copper housing 12 is roughened, and such surface 32 may be obtained by, for example, a cutting or a shot blast process. By virtue of the provision of a roughened surface 32, the overall cooling effect of the stabilizer 10 is greatly enhanced.

With a superconductor constructed as described hereinabove, when the superconductive state changes into the normal conductive state, most of the current bypasses the monolithic superconductive elements 26 and flows through the highly pure aluminum portion 20 of the lid or cover member 16. The highly pure copper housing 12 provides an auxilary bypass for the current and, during the bypass operation, the housing 12 and lid or cover member 16 generate a great deal of heat; however, the roughened outer surface 32 formed on the housing 12 is always cooled by a coolant such as, for example, liquid helium, thereby ensuring that the radiated heat is sufficiently transferred to the coolant.

In tests of a superconductor constructed in the manner described hereinabove, the superconductor was able to provide for a current flow of 5600 amps at a magnetic field of 11 TESLA ($1.1 \times 10^5$ gauss). Moreover, although the section of the pure aluminum portion 20 of the lid or cover member 16 is less than half of the cross sectional area of a generally employed lid or cover member of pure copper, the superconductor of the present invention increased the current flow by up to 80% or more, as compared to a superconductor using such generally employed lid or cover member of pure copper.

Figure 2:
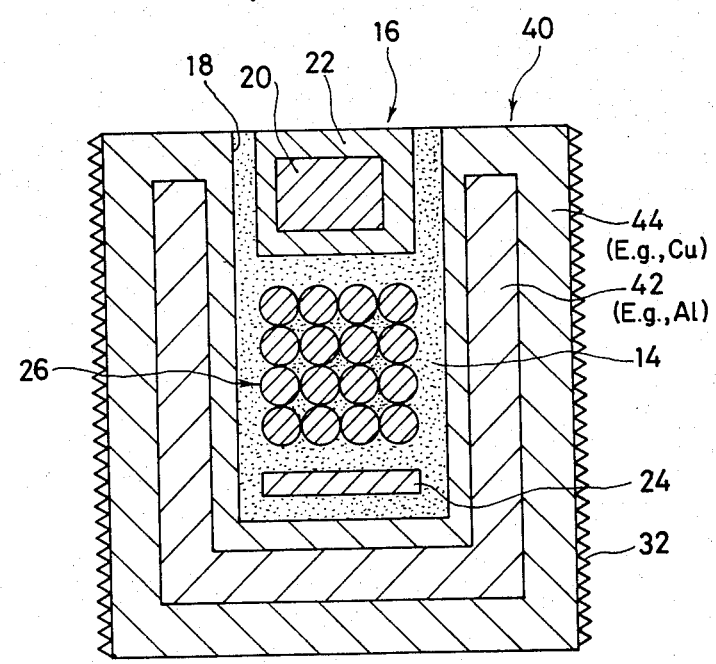
FIG. 2 is a cross-sectional view of another embodiment of an integrated superconductor constructed in accordance with the present invention.

As shown in FIG. 2, a stabilizer generally designated by the reference numeral 40 includes, as with the stabilizer 10 of FIG. 1, a housing 44 of a highly pure copper, in which is arranged a highly pure aluminum member 42. The aluminum member 42 is fashioned so as to have, for example, a U-shaped cross-sectional configuration and, as shown in FIG. 2, the aluminum member is embedded in the housing 44 in such a manner so as to extend around the channel or slot 14, e.g., on the three sides thereof. As with the embodiment of FIG. 1, the housing 42 is provided with a channel or slot 14 having an opening 18 adapted to be covered or closed by a lid or cover member 16 which is integrated into the housing 44 in the same manner as described hereinabove in connection with FIG. 1. Additionally, the housing 42 is provided with a roughened outer surface 32 for enhancing the cooling effects as well as a reinforcing member 24 adapted to increase the mechanical strength of the superconductor.

While a superconductor constructed in accordance with the embodiment of FIG. 2 is somewhat reduced in strength as compared to that of FIG. 1, the heat generated during a transistion from a superconductive state to a normal conductive state is generally also considerably reduced.

While we have shown and described two embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

We claim:
1. An integrated superconductor comprising:
   (1) a housing means, including a slot means for accommodating at least one monolithic superconductive member, said slot means forming an opening in said housing means;
   (2) at least one monolithic superconductive member accommodated in said slot means;

(3) a cover means inserted into said opening in the housing means, said cover means including a highly pure aluminum portion having an outer surface thereof covered with a highly pure copper portion; and (4) means for bonding and integrating said at least one monolithic superconductive member, said housing means, and said cover means, said means for bonding and integrating providing electrical conductivity among the at least one monolithic superconductive member, said housing means and said cover means.

2. An integrated superconductor as claimed in claim 1, wherein said housing means is made of a highly pure copper.

3. An integrated superconductor as claimed in claim 1, wherein said housing means comprises a highly pure aluminum member embedded in highly pure copper.

4. An integrated superconductor as claimed in claim 3, wherein reinforcing means are disposed at least in a bottom area of the slot means.

5. An integrated superconductor as claimed in claim 4, wherein said aluminum member has a substantially U-shaped cross-sectional configuration and is disposed so as to extend around said slot means.

6. An integrated superconductor as claimed in claim 5, wherein a plurality of monolithic superconductive elements are accommodated in the slot means, each of said monolithic superconductive elements including a plurality of copper clad superconductive wires disposed in a copper conduit means formed in the monolithic superconductive elements.

7. An integrated superconductor as claimed in claim 6, wherein said housing means is provided with means for enhancing cooling of said housing means.

8. An integrated superconductor as claimed in claim 3, wherein a plurality of monolithic superconductive members are accommodated in the slot means, each of said monolithic superconductive members including a plurality of copper clad superconductive wires disposed in a copper conduit means formed in the monolithic superconductive members.

9. An integrated superconductor as claimed in claim 3, wherein said means for bonding includes a solder material.

10. An integrated superconductor as claimed in claim 1, wherein a plurality of monolithic superconductive members are accommodated in the slot means, each of said monolithic superconductive members including a pluraity of copper clad superconductive wires disposed in a copper conduit means formed in the monolithic superconductive members.

11. An integrated superconductor as claimed in claim 10, wherein said housing means is provided with means for enhancing cooling of the housing means.

12. An integrated superconductor as claimed in claim 1, wherein said means for bonding includes a solder material.

13. An integrated superconductor as claimed in claim 1, wherein a reinforcing means is accommodated in said slot means and interposed between said at least one monolithic superconductive memeber and the bottom of said slot means.

14. An integrated superconductor as claimed in claim 13, wherein said housing means is made of a highly pure copper.

15. An integrated superconductor as claimed in claim 14, wherein said means for bonding includes a solder material.

16. An integrated superconductor as claimed in claim 13, wherein said housing means includes a highly pure aluminum member embedded in highly pure copper.

17. An integrated superconductor as claimed in claim 5, wherein the slot means has three sides, and said aluminum member extends around the three sides of said slot means.

18. An integrated superconductor as claimed in claim 13, wherein said reinforcing means comprises a stainless steel plate.

19. An integrated superconductor as claimed in claim 11, wherein the means for enhancing cooling of the housing means is a roughened outer surface of the housing.

20. An integrated superconductor as claimed in claim 1, wherein said means for bonding and integrating is conductive.

* * * * *